United States Patent
Fosnight et al.

(10) Patent No.: US 9,411,332 B2
(45) Date of Patent: Aug. 9, 2016

(54) AUTOMATED MECHANICAL HANDLING SYSTEMS FOR INTEGRATED CIRCUIT FABRICATION, SYSTEM COMPUTERS PROGRAMMED FOR USE THEREIN, AND METHODS OF HANDLING A WAFER CARRIER HAVING AN INLET PORT AND AN OUTLET PORT

(71) Applicant: GLOBALFOUNDRIES, Inc., Grand Cayman (KY)

(72) Inventors: William Fosnight, Saratoga Springs, NY (US); Isaac Sarek Banner, Saratoga Springs, NY (US); Stephen Bradley Miner, Gansevoort, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 360 days.

(21) Appl. No.: 14/180,560

(22) Filed: Feb. 14, 2014

(65) Prior Publication Data
US 2015/0234378 A1    Aug. 20, 2015

(51) Int. Cl.
*H01L 21/677* (2006.01)
*G05B 19/418* (2006.01)

(52) U.S. Cl.
CPC .. *G05B 19/4184* (2013.01); *G05B 2219/45031* (2013.01); *H01L 21/67775* (2013.01)

(58) Field of Classification Search
CPC ................. G05B 19/4184; G05B 2219/45031; H01L 21/677; H01L 21/67769; H01L 21/67775
USPC ......... 141/63–66, 98; 414/935, 937, 939–940
See application file for complete search history.

(56) References Cited

U.S. PATENT DOCUMENTS

| | | | | |
|---|---|---|---|---|
| 5,879,458 A | * | 3/1999 | Roberson, Jr. .... | H01L 21/67017 118/715 |
| 5,988,233 A | | 11/1999 | Fosnight et al. | |
| 6,042,651 A | * | 3/2000 | Roberson, Jr. .... | H01L 21/67017 118/715 |
| 6,056,026 A | | 5/2000 | Fosnight et al. | |
| 6,164,664 A | | 12/2000 | Fosnight et al. | |
| 6,221,163 B1 | * | 4/2001 | Roberson, Jr. .... | H01L 21/67017 118/715 |
| 6,319,297 B1 | | 11/2001 | Fosnight | |
| 6,368,411 B2 | * | 4/2002 | Roberson, Jr. .... | H01L 21/67017 118/715 |
| 6,808,352 B2 | * | 10/2004 | Seita ................ | H01L 21/67379 414/217.1 |
| RE39,241 E | | 8/2006 | Fosnight | |
| 8,936,050 B2 | * | 1/2015 | Sugawara ......... | H01L 21/67772 141/64 |
| 9,257,320 B2 | * | 2/2016 | Fosnight .......... | H01L 21/67775 |

(Continued)

OTHER PUBLICATIONS

U.S. Appl. No. 13/910,683, filed Jun. 5, 2013.

*Primary Examiner* — Nicolas A Arnett
(74) *Attorney, Agent, or Firm* — Ingrassia Fisher & Lorenz, P.C.

(57) ABSTRACT

Automated mechanical handling systems (AMHS) for integrated circuit fabrication, system computers programmed for use in the AMHSs, and methods of handling a wafer carrier having an inlet port and an outlet port are provided. An exemplary method of handling the wafer carrier includes providing a plurality of carrier storage positions that are adapted to receive the wafer carrier. The carrier storage positions include a presence sensor and a gas nozzle. The wafer carrier is loaded into one of the carrier storage positions. The presence of the wafer carrier in the carrier storage position is sensed with the presence sensor. A malfunction in gas flow through the inlet port is identified in the carrier storage position that contains the wafer carrier. The wafer carrier is relocated to another carrier storage position in response to identifying the malfunction.

20 Claims, 2 Drawing Sheets

(56) References Cited

U.S. PATENT DOCUMENTS

| | | | | |
|---|---|---|---|---|
| 2001/0042439 A1* | 11/2001 | Roberson, Jr. | .... | H01L 21/67017 95/8 |
| 2003/0049101 A1* | 3/2003 | Seita | ................. | H01L 21/67379 414/217 |
| 2003/0185655 A1* | 10/2003 | Uchimaki | ......... | H01L 21/67276 414/217 |
| 2013/0343844 A1* | 12/2013 | Fosnight | .............. | B65G 1/0464 414/281 |
| 2014/0360531 A1* | 12/2014 | Fosnight | ........... | H01L 21/67775 134/21 |

* cited by examiner

AUTOMATED MECHANICAL HANDLING SYSTEMS FOR INTEGRATED CIRCUIT FABRICATION, SYSTEM COMPUTERS PROGRAMMED FOR USE THEREIN, AND METHODS OF HANDLING A WAFER CARRIER HAVING AN INLET PORT AND AN OUTLET PORT

TECHNICAL FIELD

The technical field generally relates to automated mechanical handling systems (AMHSs) for integrated circuit fabrication, system computers programmed for use in the AMHSs, and methods of handling a wafer carrier. More particular, the technical field relates to AMHSs, system computers programmed for use in the AMHSs, and methods of handling wafer carriers having an inlet port and an outlet port that enable monitoring of wafer environmental control (WEC).

BACKGROUND

Automated mechanical handling systems (AMHSs) are widely used during integrated circuit fabrication to organize, handle, and track supplied wafers in a fabrication facility to use in fabrication of integrated circuits in the most efficient manner possible. AMHSs generally employ carrier storage positions, e.g., storage positions in a stocker or zero footprint storage bins. The carrier storage positions are adapted to receive a wafer carrier, such as a front opening shipping box (FOSB). The AMHSs also generally include a container transporter that is adapted to move the FOSBs into and out of the carrier storage positions. During handling, FOSBs that include the supplied wafers are removed from the carrier storage positions and unwrapped, followed by placing the supplied wafers and an empty front opening unified pod (FOUP) on a sorter. The FOUP allows the supplied wafers to be accessed during automated integrated circuit fabrication. The supplied wafers are transferred to the empty FOUP on the sorter. The FOUP is then generally returned to the carrier storage position, where the FOUP remains until the supplied wafers are needed.

Queue times during automated integrated circuit fabrication have a significant impact on integrated circuit quality due to environmental impact on materials that are used to fabricate the integrated circuits. In particular, prolonged exposure to moisture or other airborne environmental contaminants such as organic compounds and ions can lead to corrosion and/or crystallization on the wafers, thereby resulting in out-of-specification integrated circuits that must be discarded or reworked. To avoid excessive queue times, fabrication facilities often employ production holds at various stages in the fabrication to ensure that queue times are not exceeded that would otherwise result in rework and scrap of fabricated integrated circuits. Wafer Environment Control (WEC) solutions are another option that has been considered to prevent contamination of the supplied wafers from moisture and organic compounds that may be present in the ambient atmosphere surrounding the carrier storage positions while the supplied wafers are stored. The WEC solutions, in principle, provide a chemically inert environment surrounding the supplied wafers while the supplied wafers await use during integrated circuit fabrication, thereby rendering long queue times immaterial to product quality. WEC solutions have been developed whereby wafer carriers are provided with in inlet port and an outlet port. When placed in the carrier storage positions, an inert gas such as nitrogen is introduced into the wafer carrier, and the inert gas may be drawn through the wafer carrier by applying a vacuum to the outlet port. Alternatively, gases may simply escape from the outlet port due to a pressure differential created by the flow of inert gas into the wafer carrier. However, if a malfunction occurs in gas flow through the inlet port and/or vacuum applied to the outlet port in the carrier storage position that contains the wafer carrier, effectiveness of the WEC may be compromised leading to corrosion and/or crystallization on the wafers and resulting in a missed processing event.

Accordingly, it is desirable to provide AMHSs, system computers programmed for use in the AMHSs, and methods of handling a wafer carrier having an inlet port and an outlet port that enable minimization of missed processing events due to malfunction in gas flow through the inlet port in carrier storage positions. Furthermore, other desirable features and characteristics of the present invention will become apparent from the subsequent detailed description of the invention and the appended claims, taken in conjunction with the accompanying drawings and this background of the invention.

BRIEF SUMMARY

Automated mechanical handling systems (AMHS) for integrated circuit fabrication, system computers programmed for use in the AMHSs, and methods of handling a wafer carrier having an inlet port and an outlet port are provided. In an embodiment, a method of handling a wafer carrier that has an inlet port and an outlet port includes providing a plurality of carrier storage positions that are adapted to receive the wafer carrier. The carrier storage positions include a presence sensor, and a gas nozzle for providing a gas flow to the wafer carrier through the inlet port. The presence sensor is in electrical communication with a control module that is adapted to control gas flow through the inlet port. The wafer carrier is loaded into one of the carrier storage positions. The presence of the wafer carrier in the carrier storage position is sensed with the presence sensor. A malfunction in gas flow through the inlet port is identified in the carrier storage position that contains the wafer carrier. The wafer carrier is relocated to another carrier storage position in response to identifying the malfunction.

In another embodiment, a system computer is programmed with computer instructions that cause the system computer to receive data that is associated with gas flow through an inlet port of wafer carriers in carrier storage positions. The system computer is further programmed with computer instructions to identify a malfunction in the gas flow through the inlet port of one of the wafer carriers based upon the received data. The system computer is further programmed with computer instructions to inhibit loading of subsequent wafer carriers into the carrier storage position that is associated with the identified malfunction.

In another embodiment, an automated mechanical handling system for integrated circuit fabrication includes a plurality of carrier storage positions that are adapted to receive a wafer carrier. Each carrier storage position includes a gas nozzle that is adapted to contact an inlet port of the wafer carrier for introducing gas into the wafer carrier. A container transporter is adapted to move the wafer carrier into and out of the plurality of carrier storage positions. A system computer is programmed with computer instructions that cause the system computer to receive data that is associated with gas flow through the inlet port of wafer carriers in carrier storage positions. The system computer is further programmed with computer instructions to identify a malfunction in the gas flow through the inlet port of one of the wafer carriers based upon the received data. The system computer is further programmed with computer instructions to inhibit loading of subsequent wafer carriers into the carrier storage position that is associated with the identified malfunction.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description.

Automated mechanical handling systems (AMHSs), system computers programmed for use in the AMHSs, and methods of handling a wafer carrier having an inlet port and an outlet port are provided herein. The methods described herein enable minimization of missed processing events due to malfunction in gas flow through the inlet port in carrier storage positions of the AMHSs by relocating the wafer carrier to another carrier storage position in response to identifying the malfunction. As referred to herein, "malfunction" refers to any disruption in gas flow through the inlet port in carrier storage positions that falls below a predetermined threshold deemed acceptable to provide effective wafer environmental control (WEC). The methods may be carried out using the system computers, which may be programmed to receive data associated with gas flow through an inlet port of a wafer carrier that is disposed in a carrier storage position, with the system computers further programmed to identify a malfunction in the gas flow through the inlet port of the wafer carrier based upon the received data. The wafer carrier may be relocated to another carrier storage position either automatically using the system computer or manually by a system user in response to identifying the malfunction, thereby avoiding a material disruption in WEC within the wafer carriers and minimizing missed processing events that may otherwise occur due to inadequate WEC within the wafer carrier. In this regard, in accordance with the methods described herein, the malfunction is identified in the stocker followed by an affirmative response by relocating the wafer carrier to another carrier storage position to avoid the disruption in WEC within wafer carriers that are disposed in a malfunctioning carrier storage position.

Figure 1:
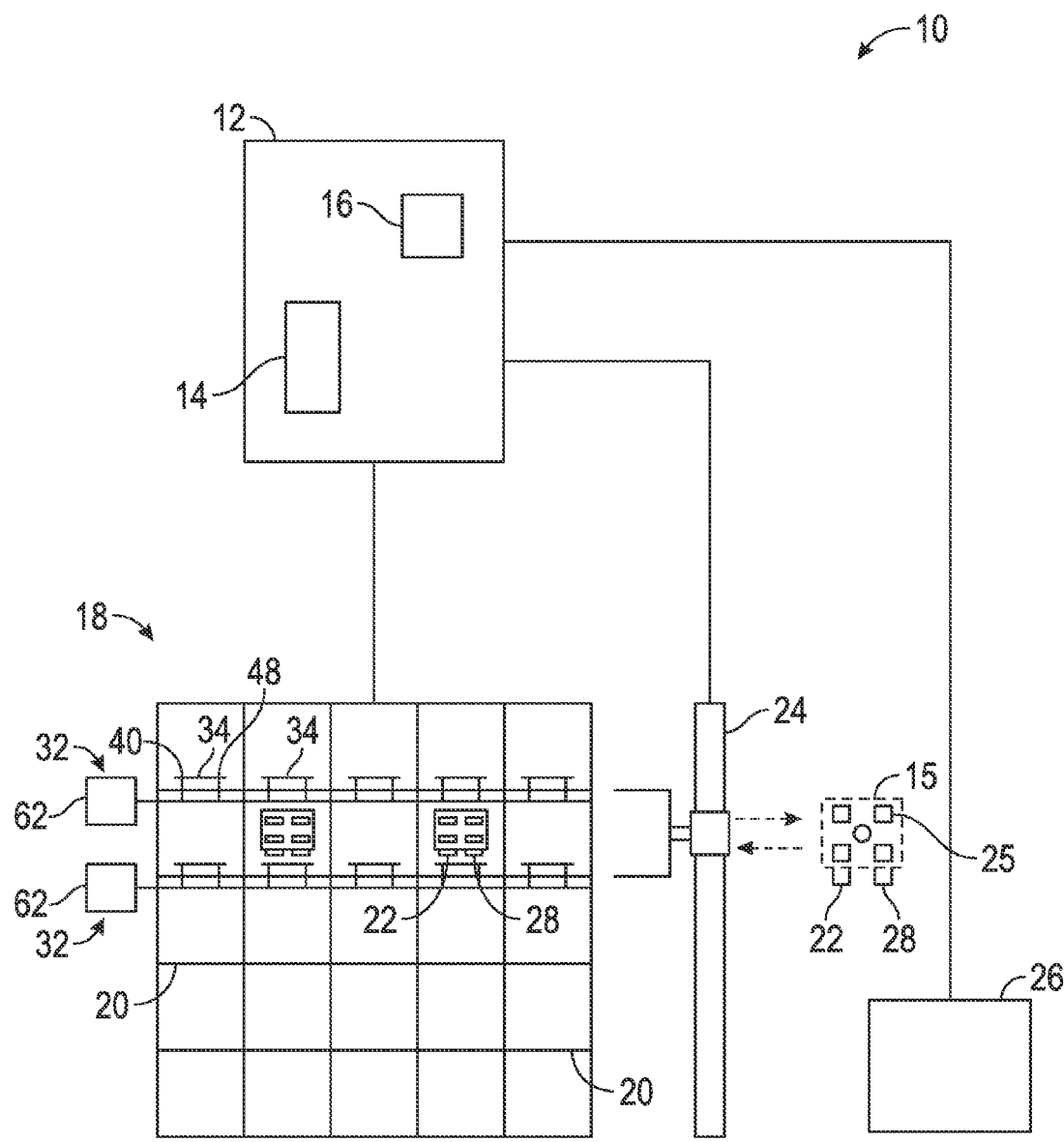
FIG. 1 is an automated mechanical handling system in accordance with an embodiment.

An embodiment of an automated mechanical handling system (AMHS) 10 and an embodiment of a wafer carrier purge apparatus 32 that may be used in the AMHS 10 will now be described with reference to FIGS. 1 and 2. In an embodiment and as shown in FIG. 1, the AMHS 10 includes a stocker 18 that has a plurality of carrier storage positions 20, with the carrier storage positions 20 adapted to receive a wafer carrier 15 that includes supplied wafers 25. As referred to herein, the wafer carrier 15 of interest is also known in the art as a front opening unified pod (FOUP) and is the container to which the supplied wafers 25 are transferred and within which the supplied wafers 25 remain until a production lotstart 26 is ready to receive the wafer carrier 15. However, in other embodiments, it is to be appreciated that carrier storage positions may be ZFS bins, under track storage (UTS) bins, or may also be adapted to receive other types of containers such as front opening shipping boxes (FOSBs), which contain supplied wafers 25 that are provided directly from a supplier and which may be stored until the supplied wafers 25 are ready to be transferred to the FOUP 15 in accordance with convention waferstart process flows. The wafer carrier 15 includes an inlet port 22 and an outlet port 28 for enabling gases to be introduced into and removed from the wafer carrier 15, thereby facilitating purging with the wafer carrier purge apparatus 32. The stocker 18 stores and maintains the wafer carriers 15 in the carrier storage positions 20 to enable organization and storage of the wafer carriers 15 until the production lotstart 26 is ready to receive the supplied wafers 25. A container transporter 24 is adapted to move the wafer carrier 15 into and out of the plurality of carrier storage positions 20 in the stocker 18.

The AMHS 10 further includes a system computer 12 that is programmed with computer instructions that cause the system computer 12 to conduct various actions as described in further detail below. In embodiments, the system computer 12 includes a data input interface 14 and a storage medium 16 for registering supplied wafers 25 and tracking locations of the supplied wafers 25 through the fabrication facility. The data input interface 14 can be a user interface, such as a keyboard and visual display, for manually entering data into the system computer 12. Alternatively, the data input interface 14 can be an interface that enables electronic transfer of data into the system computer 12 from an external source, e.g., a USB port, wireless or wired network connection that is open to receiving the data, and the like. The container transporter 24 may be controlled by the system computer 12, with the system computer 12 adapted to control movement of the wafer carriers 15 into and out of the plurality of carrier storage positions 20 in the stocker 18 using the container transporter 24.

In an embodiment and as shown in FIG. 1, the carrier storage positions 20 include a gas nozzle 40 and a vacuum nozzle 48, although it is to be appreciated that the vacuum nozzle 48 is optional. The gas nozzle 40 is adapted to contact the inlet port 22 of the wafer carrier 15 for providing a gas flow to the wafer carrier 15 through the inlet port 22. The gas that is provided to the gas nozzle 40 can be any gas that is generally unreactive under ambient conditions, such as a noble gas or nitrogen. Alternatively, the gas that is provided to the gas nozzle 40 may be clean, dry air. In a specific embodiment, the gas is nitrogen. The gas provided to the gas nozzle 40 may be substantially pure inert gas, e.g., 99 weight % pure inert gas such as nitrogen, or may be a mixture of gases.

When present and as shown in FIG. 1, the vacuum nozzle 48 is adapted to apply a vacuum to the wafer carrier 15 through the outlet port 28. However, it is to be appreciated that gas may flow out of the wafer carrier 15 through the outlet port 28 within the need for vacuum. The vacuum nozzle 48 is spaced from the gas nozzle 40, and the vacuum nozzle 48 is adapted to capture gas that escapes from the wafer carrier 15 through the outlet port 28 of the wafer carrier 15. In this regard, the gas that is provided to the wafer carrier 15 from the gas nozzle 40 through the inlet port 22 of the wafer carrier 15 may be circulated through the wafer carrier 15 and out through the outlet port 28 and the vacuum nozzle 48 under the influence of vacuum applied to the vacuum nozzle 48. Referring to FIG. 2, the gas nozzle 40 and the vacuum nozzle 48 may be provided in purge plates 34 that are included in a wafer carrier purge apparatus 32, and the purge plates 34 may be disposed in the carrier storage positions 20. As also shown in FIG. 2, a presence sensor 58 is provided in each purge plate 34 and, thus, is also disposed in the carrier storage positions 20. The presence sensor 58 registers a presence or absence of the wafer carrier 15 in the carrier storage position 20 and may function through any sensing mechanism, such as optical or physical sensing mechanisms. For example, in an embodiment, the presence sensor 58 includes a photoelectric sensor 58. Although FIG. 2 shows the gas nozzle 40, the vacuum nozzle 48, and the presence sensor 58 in the purge plates 34 of the wafer carrier purge apparatus 32, it is to be appreciated that in other embodiments and although not shown, the gas nozzle, the vacuum nozzle, and the presence sensor may be incorporated into the carrier storage positions 20 independent of the purge plates 34.

Figure 2:
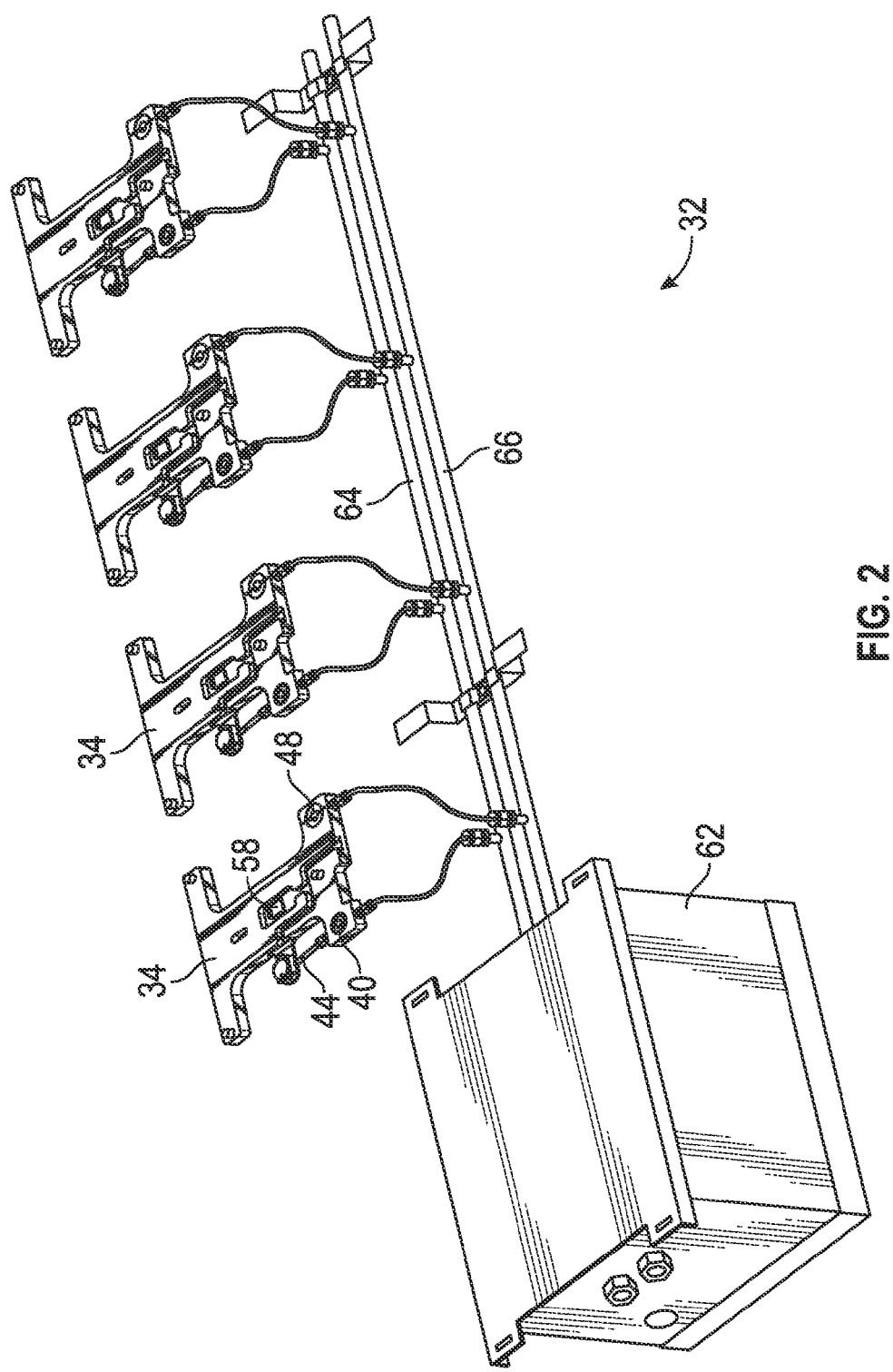
FIG. 2 is perspective schematic view of a wafer carrier purge apparatus including a purge plate for use in the automated mechanical handling system of FIG. 1 in accordance with an embodiment.

In an embodiment and as shown in FIG. 2, a control module 62 is provided and is adapted to control gas flow through the inlet port 22, and may also control vacuum applied to the outlet port 28 of the wafer carrier 15. More specifically, a gas manifold 64 is provided in fluid communication between the control module 62 and the gas nozzle 40, and a vacuum manifold 66 is provided in fluid communication between the control module 62 and the vacuum nozzle 48. The control module 62 is adapted to control fluid flow in the gas manifold 64 and the vacuum manifold 66. In this embodiment, the wafer carrier purge apparatus 32 may include additional purge plates 34, with the gas manifold 64 and the vacuum manifold 66 in fluid communication with the gas nozzle 40 and the vacuum nozzle 48 of each of the purge plates 34. The presence sensors 58 may be in electrical communication with the control module 62, with the control module 62 adapted to control gas flow through the gas nozzles and vacuum applied to the vacuum nozzles for the purge plates 34.

An embodiment of a method of handling a wafer carrier 15 during integrated circuit fabrication will now be described using the AMHS 10 and wafer carrier purge apparatus 32 shown in FIGS. 1 and 2. In accordance with the exemplary method, safeguards are put in place to ensure that proper WEC is established in the wafer carrier 15 and that missed processing events due to malfunction in gas flow through the inlet port 22 in the carrier storage positions 20 are minimized. For example, the wafer carrier 15 is loaded into one of the carrier storage positions 20, whereupon the presence of the wafer carrier 15 in the carrier storage position 20 is sensed with the presence sensor 58. The presence sensor 58 is in electrical communication with the control module 62 for sensing the presence or absence of the wafer carrier 15 in the particular carrier storage position 20 that is controlled by the control module 62. Additionally, the control module 62 may be in data communication with the system computer 12 to enable greater overall control of the AMHS 10. Gas flow is then provided through the gas nozzle 40 and vacuum may be applied to the vacuum nozzle 48 upon sensing the presence of the wafer carrier 15 in the carrier storage position 20, thereby initiating WEC for the wafer carrier 15.

In accordance with embodiments, the method further includes communicating data associated with the gas flow to the wafer carrier 15 through the inlet port 22 to the system computer 12. By "data associated with the gas flow to the wafer carrier 15 through the inlet port 22", it is meant any data that is indicative of gas flow through the wafer carrier 15 and need not necessarily be actual measurements of gas flow through the inlet port 22 or the outlet port 28, respectively. For example, the data communicated to the system computer 12 may include pressure or flow measurements of gas in the gas manifold 64 and/or the vacuum manifold 66, with variations in the pressure or flow measurements enabling identification of a malfunction in gas flow through the inlet port 22 in the carrier storage position 20 that contains the wafer carrier 15. In embodiments, the data associated with the gas flow to the wafer carrier 15 through the inlet port 22 in the carrier storage position 20 is measured using the control module 62. However, it is to be appreciated that in embodiments, an independent sensor 44 such as a pressure sensor may be employed to obtain the desired data associated with the gas flow to the wafer carrier 15 through the inlet port 22.

In embodiments, the system computer 12 is programmed with computer instructions that cause the system computer 12 to identify the malfunction in gas flow through the inlet port 22 and/or vacuum applied to the outlet port 28 in the carrier storage position 20. The malfunction may be identified when the data communicated to the system computer 12 falls outside of pre-set parameters that represent acceptable values for proper WEC function. The malfunction may be, for example, an impediment of flow of the inert gas through the gas manifold 64, or an incomplete seal between the gas nozzle 40 and the inlet port 22. In response to identifying the malfunction in gas flow through the inlet port 22 and/or vacuum applied to the outlet port 28 in the carrier storage position 20, the wafer carrier 15 is relocated to another carrier storage position 20 to ensure that no material disruption in WEC within the affected wafer carrier 15 occurs.

Various actions may be taken to ensure expedient relocation of the affected wafer carrier 15. For example, in embodiments, the affected wafer carrier 15 may be automatically moved to another carrier storage position 20 using the system computer 12, whereby the system computer 12 controls the container transporter 24 and initiates movement of the affected wafer carrier 15 out of the carrier storage position 20 associated with the identified malfunction. In other embodiments, an error message is generated using the system computer 12 in response to identifying the malfunction and the error message may be employed as a prompt to have a system user manually relocate the wafer carrier 15. The error message may be generated in various forms. For example, the error message may be an auditory message a message shown in the visual display of the system computer 12. Further, a communication of the error message may be transmitted to a remote electronic device, such as a tablet computer or cellphone carried by a system user, using the system computer 12. It is to be appreciated that the error message may be generated independent of automatic relocating of the affected wafer carrier 15 for purposes of notifying a system user that the malfunction occurred in the particular carrier storage position 20 so that appropriate service can be rendered as described in further detail below.

In embodiments, after identifying the malfunction and after relocating the wafer carrier 15 to the other carrier storage position 20, the carrier storage position 20 that is associated with the identified malfunction is shut down until service is rendered to address the identified malfunction. The carrier storage position 20 that is associated with the identified malfunction may be shut down by physically blocking the carrier storage position 20 from receiving subsequent wafer carriers 15, such as by placing a dummy carrier (not shown) in the carrier storage position 20, placing a barrier (not shown) across the carrier storage position 20, and the like so that a system user is prevented from manually loading subsequent wafer carriers 15 into the affected carrier storage position 20. In other embodiments, the system computer 12 may be used to inhibit loading of subsequent wafer carriers 15 into the carrier storage position 20 associated with the identified malfunction. By "inhibit loading", it is meant that the system computer 12 may block automatic loading of subsequent wafer carriers 15 or may employ the error message to bring attention to the identified malfunction, thereby prompting appropriate service. For example, the carrier storage position 20 may be recognized as unavailable within the system computer 12 until an affirmative action is taken by a system user to re-qualify the carrier storage position 20 in the system computer 12 as being available. Generation of the error message may be connected to the recognition within the system computer 12 that the carrier storage position 20 is unavailable, and the system computer 12 may be programmed to prompt acknowledgement of the error message by a system user that is using the system computer 12. The system computer 12 may be further programmed with computer instructions to log an acknowledgement of the error message by the system user, thereby providing a verifiable record of attention given to the identified malfunction with the carrier storage position 20.

In embodiments, to ascertain that the wafer carrier 15 in the carrier storage position 20 associated with the identified malfunction is relocated as a first priority, the system computer 12 may be programmed to disable an ability to inhibit loading of subsequent wafer carriers 15 into the carrier storage position 20 associated with the identified malfunction while the presence of the wafer carrier 15 is sensed in the carrier storage position 20 associated with the identified malfunction. Once the wafer carrier 15 is relocated, the system computer 12 then allows inhibition of loading of subsequent wafer carriers 15 into the carrier storage position 20 associated with the identified malfunction.

As alluded to above, the carrier storage position 20 that is associated with the malfunction is eventually released for loading of subsequent wafer carriers 15 thereinto. In embodiments, the carrier storage position 20 is manually released, such as by a system user removing a physical barrier from the carrier storage position 20 that is associated with the malfunction. In other embodiments, the carrier storage position 20 that is associated with the malfunction is released by re-qualifying the carrier storage position 20 within the system computer 12. In an embodiment, re-qualification in the system computer 12 may occur automatically after the system computer 12 logs an acknowledgement of the error message. In other embodiments, the system computer 12 may take additional action to verify that service of the carrier storage position 20 associated with the identified malfunction has occurred. For example, the system computer 12 may prompt further inputs to verify that the appropriate service has been carried out, optionally in conjunction with providing instruction regarding the services to be performed. Once the carrier storage position 20 associated with the identified malfunction is re-qualified, the carrier storage position 20 may become available within the system computer 12 for loading of subsequent wafer carriers 15.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A method of handling a wafer carrier having an inlet port and an outlet port, wherein the method comprises:
    providing a plurality of carrier storage positions adapted to receive the wafer carrier, wherein the carrier storage positions comprise a presence sensor, and a gas nozzle for providing a gas flow to the wafer carrier through the inlet port, and wherein the presence sensor is in electrical communication with a control module adapted to control gas flow through the inlet port;
    loading the wafer carrier into one of the carrier storage positions;
    sensing the presence of the wafer carrier in the carrier storage position with the presence sensor;
    identifying a malfunction in gas flow through the inlet port in the carrier storage position containing the wafer carrier; and
    relocating the wafer carrier to another carrier storage position in response to identifying the malfunction.

2. The method of claim 1, wherein identifying the malfunction comprises sensing data associated with the gas flow to the wafer carrier through the inlet port in the carrier storage position using the control module.

3. The method of claim 2, further comprising communicating data associated with the gas flow to the wafer carrier through the inlet port to a system computer.

4. The method of claim 3, wherein the system computer is programmed with computer instructions causing the system computer to identify the malfunction in gas flow through the inlet port in the carrier storage position, and wherein identifying the malfunction comprises identifying the malfunction using the system computer.

5. The method of claim 4, wherein relocating the wafer carrier to another carrier storage position comprises automatically moving the wafer carrier to the other storage position using the system computer in response to identifying the malfunction.

6. The method of claim 4, further comprising generating an error message using the system computer in response to identifying the malfunction.

7. The method of claim 6, wherein generating the error message comprises transmitting a communication to a remote electronic device using the system computer in response to identifying the malfunction.

8. The method of claim 6, wherein the system computer is further programmed to prompt an acknowledgement of the error message by a system user using the system computer, and wherein the method further comprises logging the acknowledgement of the error message by the system user.

9. The method of claim 4, further comprising physically blocking the carrier storage position associated with the identified malfunction from receiving subsequent wafer carriers.

10. The method of claim 4, further comprising inhibiting loading of subsequent wafer carriers into the carrier storage position associated with the identified malfunction using the system computer.

11. The method of claim 10, further comprising disabling an ability to inhibit loading of subsequent wafer carriers into the carrier storage position associated with the identified malfunction while the presence of the wafer carrier is sensed in the carrier storage position associated with the identified malfunction.

12. The method of claim 10, wherein inhibiting loading of subsequent wafer carriers into the carrier storage position associated with the identified malfunction comprises blocking automatic loading of subsequent wafer carriers into the carrier storage position associated with the malfunction using the system computer.

13. The method of claim 12, further comprising releasing the carrier storage position associated with the malfunction for loading of subsequent wafer carriers thereinto.

14. The method of claim 13, wherein releasing the carrier storage position associated with the malfunction comprises re-qualifying the carrier storage position associated with the identified malfunction within the system computer.

15. The method of claim 14, wherein releasing the carrier storage position associated with the identified malfunction further comprises verifying that service of the carrier storage position associated with the identified malfunction has occurred using the system computer.

16. A system computer programmed with computer instructions causing the system computer to:
  receive data associated with gas flow through an inlet port of wafer carriers in carrier storage positions;
  identify a malfunction in the gas flow through the inlet port of one of the wafer carriers based upon the received data;
  inhibit loading of subsequent wafer carriers into the carrier storage position associated with the identified malfunction.

17. The system computer of claim 16, further programmed to initiate automated relocation of the wafer carrier to another carrier storage position in response to identifying the malfunction.

18. The system computer of claim 16, further programmed to generate an error message in response to identifying the malfunction.

19. The system computer of claim 18, further programmed to prompt acknowledgement of the error message by a system user using the system computer.

20. An automated mechanical handling system for integrated circuit fabrication, the system comprising:
  a plurality of carrier storage positions adapted to receive a wafer carrier, wherein each carrier storage position comprises:
    a gas nozzle adapted to contact an inlet port of the wafer carrier for introducing gas into the wafer carrier; and
    a container transporter adapted to move the wafer carrier into and out of the plurality of carrier storage positions; and
  a system computer programmed with computer instructions causing the system computer to:
    receive data associated with gas flow through the inlet port of wafer carriers in the carrier storage positions;
    identify a malfunction in the gas flow through the inlet port of one of the wafer carriers based upon the received data; and
    inhibit loading of subsequent wafer carriers into the carrier storage position associated with the identified malfunction.

* * * * *